United States Patent [19]
Abel

[11] Patent Number: 5,430,690
[45] Date of Patent: Jul. 4, 1995

[54] METHOD AND APPARATUS FOR PROCESSING SIGNALS TO EXTRACT NARROW BANDWIDTH FEATURES

[76] Inventor: Jonathan S. Abel, 184 Tennyson Ave., Palo Alto, Calif. 94301

[21] Appl. No.: 121,332

[22] Filed: Sep. 13, 1993

Related U.S. Application Data

[63] Continuation-in-part of Ser. No. 856,091, Mar. 20, 1992, Pat. No. 5,245,589.

[51] Int. Cl.$^6$ ............................................... H04B 1/06
[52] U.S. Cl. .................................. 367/135; 367/136; 367/124
[58] Field of Search ................ 367/135, 136, 901, 116; 364/517, 574, 724.06, 724.08; 342/192, 195, 203

[56] References Cited

U.S. PATENT DOCUMENTS 4,805,622 2/1989 Riedlinger et al. .................. 367/116
5,245,589 9/1993 Abel et al. ............................ 367/136

OTHER PUBLICATIONS

McIntyre, et al., "A Comparison of Five Algorithms for Tracking Frequency and Frequency Rate-of-Change," Proc. ICASSP90, pp. 2899-2902, Apr. 1990.
Wolcin, Joseph, "Maximum A Posteriori Estimation of Narrow-Band Signal Parameters," J. Acoust. Soc. Am., vol. 68(1), pp. 174-178, Jul. 1980.
Moll, Magnus, "A Simple Algorithm for Track Termination," Proc. ICASSP89, pp. 2700-2703, 1989.

Primary Examiner—Daniel T. Pihulic
Attorney, Agent, or Firm—Limbach & Limbach

[57] ABSTRACT

A method and apparatus for processing a set of signals to identify narrow bandwidth features of the signals, and optionally to process the signals further to extract information about the identified narrow-band features. The invention processes a set of input signal frames (a multi-dimensional pixel array) to generate a narrow-band feature signal (also a multi-dimensional pixel array) from which narrow-band features of the input signal frames can be efficiently, automatically, and unambiguously identified. In a class of preferred embodiments, the input signal frames are the power spectra of a set of sequentially measured signals. Thus, the set of input signal frames is a "spectrogram," comprising rows and columns of pixels (with row indices representing time, and column indices representing frequency). Alternatively, the input signal frames represent a data array of another type, such as a correlogram or a sequence of images. In a class of embodiments, the input signal frames are processed to identify narrow-band pixels (the subset of input signal frame pixels which represent narrow-band energy, or narrow-band processes). Then, the identified narrow-band pixels (which can be displayed as a narrow-band pixel array) undergo "feature extraction" processing to generate the output narrow-band feature signal (which can be displayed as the output image).

6 Claims, 6 Drawing Sheets

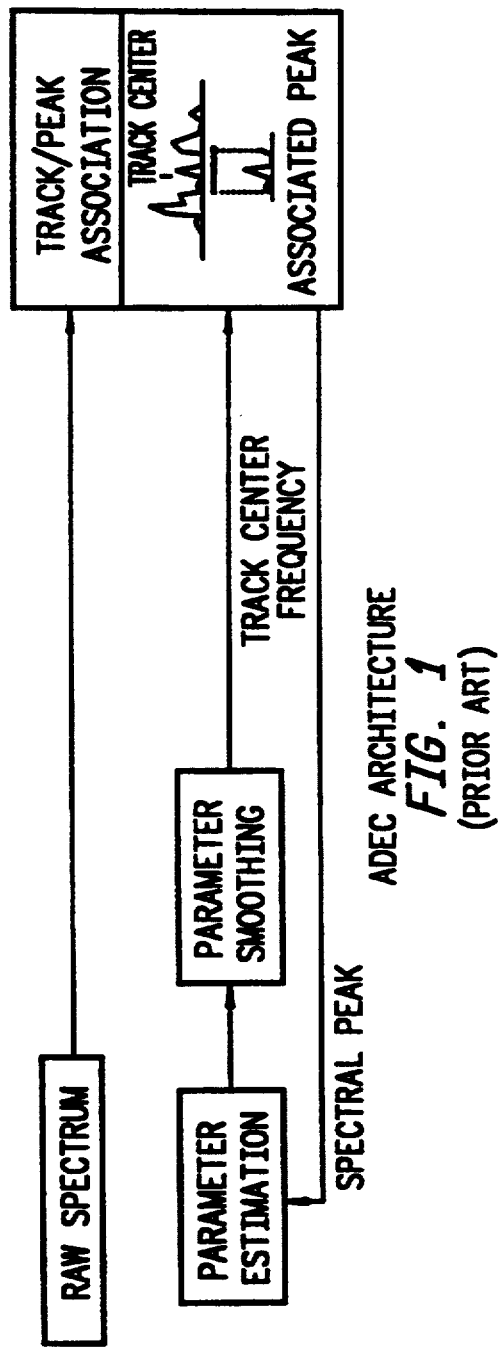
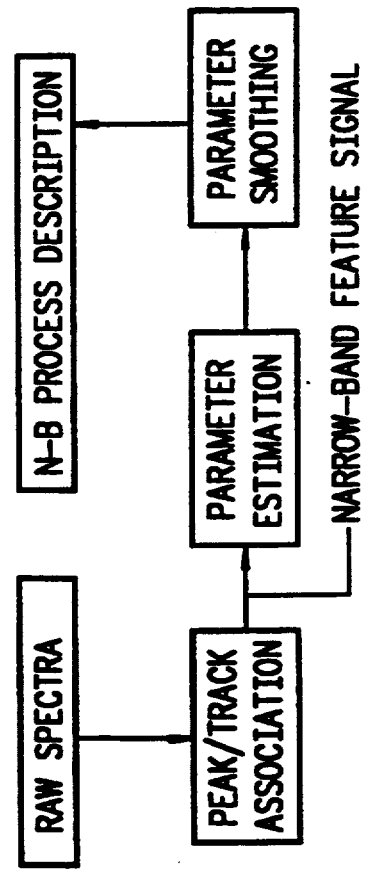

BROAD-BAND EQUALIZATION

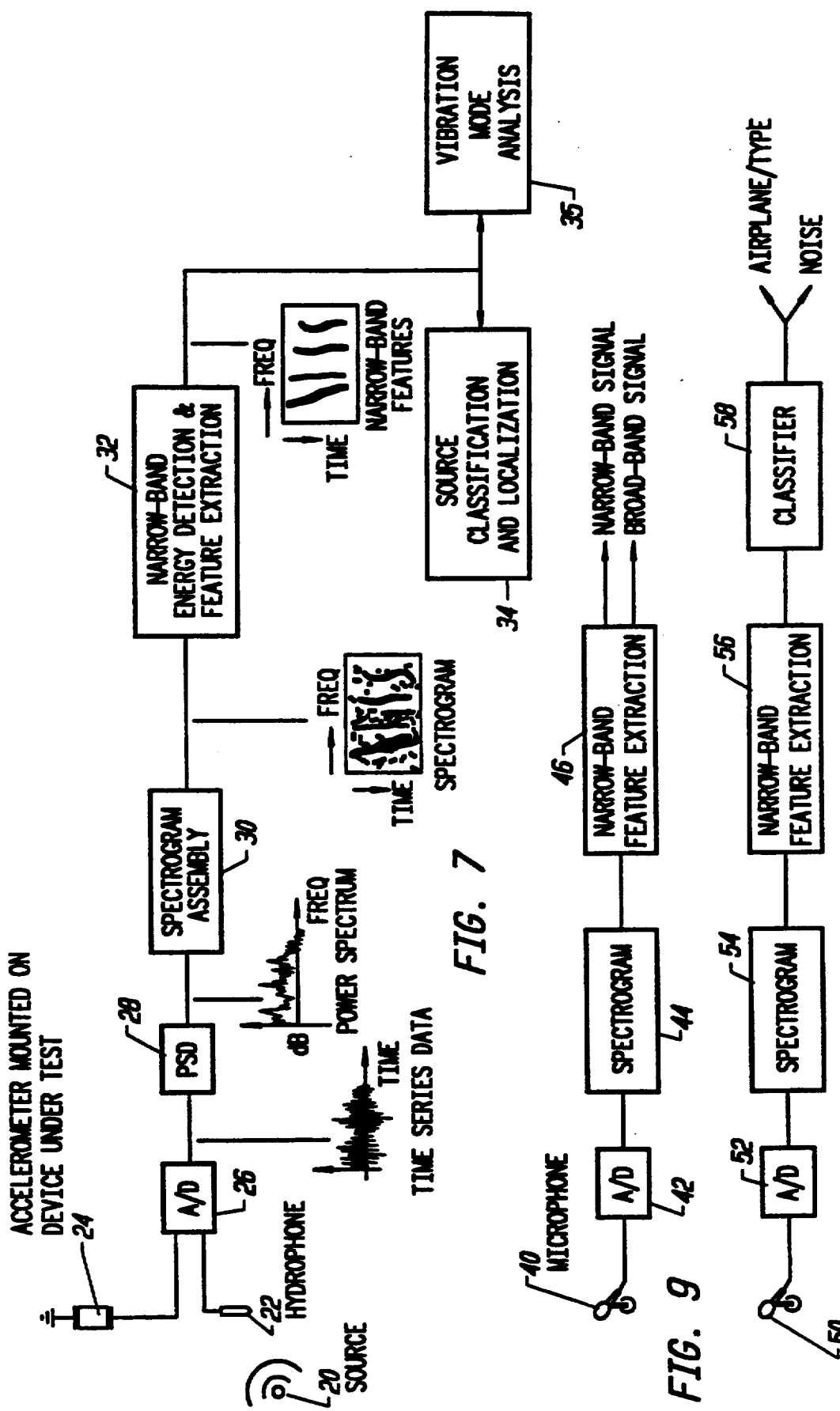

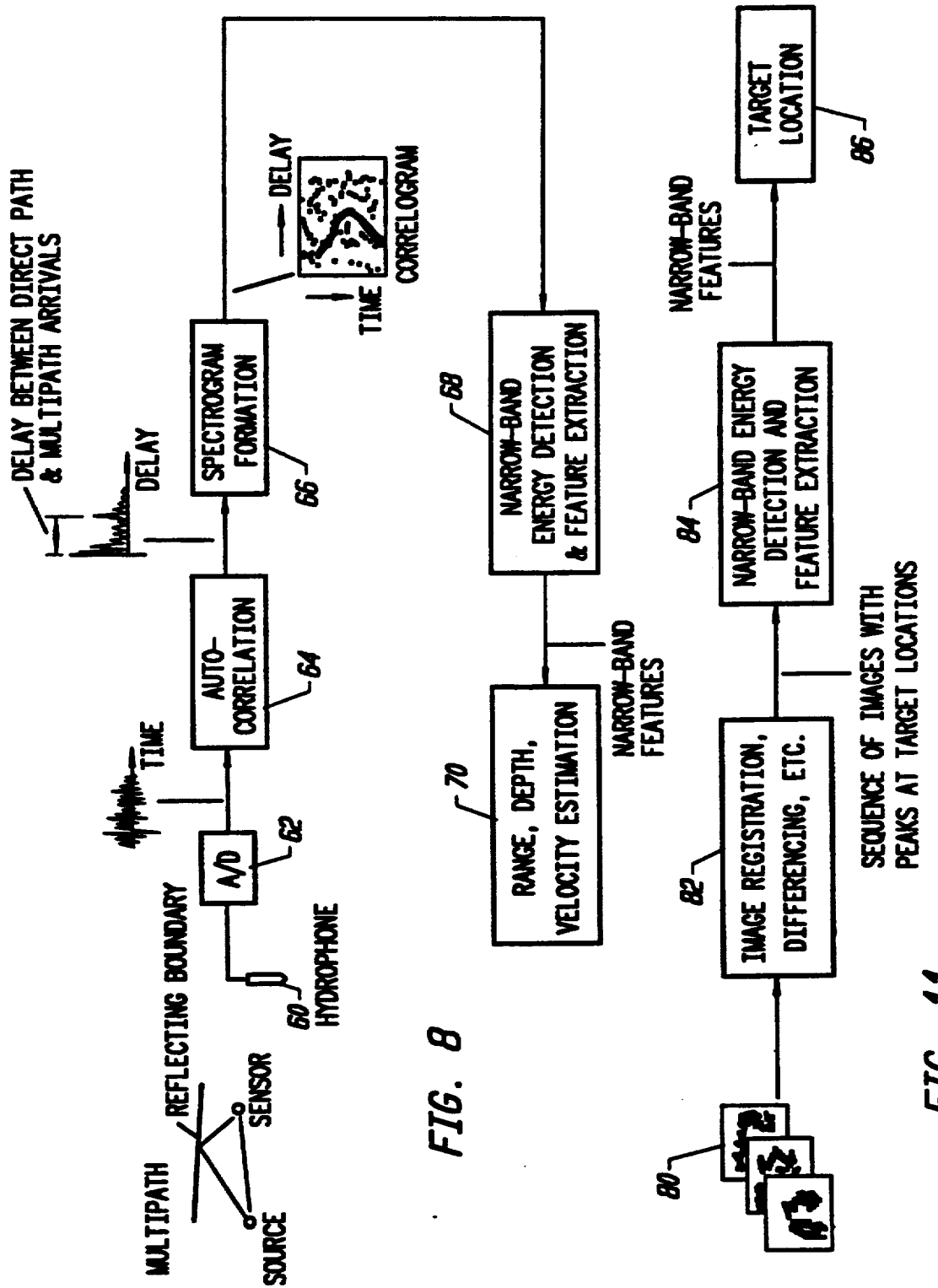

METHOD AND APPARATUS FOR PROCESSING SIGNALS TO EXTRACT NARROW BANDWIDTH FEATURES

CROSS-REFERENCE TO RELATED APPLICATION

This is a continuation-in-part of pending U.S. Ser. No. 07/856,091, filed Mar. 20, 1992, now U.S. Pat. No. 5,245,589.

FIELD OF THE INVENTION

The invention pertains to methods and apparatus for characterizing the narrow-band content of signals. A preferred embodiment of the invention pertains to signal processing methods and apparatus for identifying narrow bandwidth features of signals and optionally also processing the identified features.

BACKGROUND OF THE INVENTION

Throughout this specification, including in the claims, the expression "power spectrum" is used in a broad sense to denote the result of any time-domain to frequency-domain transformation of a signal, including digital or analog signals representing frequency-amplitude spectra.

A large class of measured signals include narrow-band signal components (i.e., periodic, or nearly periodic, components) embedded in broad-band noise. Each narrow-band signal component may represent a narrow-band process of interest, such as a vibration mode of an object which radiates or reflects radiation.

Measured signals of this type are often transformed to generate their power spectra before they undergo subsequent processing. When the power spectrum of such a signal is displayed, the narrow-band components appear as peaks (each occupying a narrow frequency window). When several of the power spectra are displayed side-by-side (each spectrum representing a signal measured at different time), the narrow-band components representing a common process will align with each other so as to appear as a linear feature (a "narrow-band feature" or "track"). However, until the present invention it had not been known how practically to implement an accurate and automated procedure for distinguishing such linear features from noise.

In a variety of applications, it is useful to process a set of input signals (each measured at a different time) to study the time dependence of each signal's narrow-band content (for example, by tracking the center frequency, bandwidth, and amplitude of at least one narrow-band feature of each signal). Such signal processing operations are sometimes referred to as "frequency tracking" operations.

Examples of frequency tracking operations include surveillance operations in which positions of one or more moving radiation sources are monitored, and vibration analysis operations in which one or more operational states of a vibrating object under test are monitored.

For example, during sonar surveillance, a sequence of sonar signals may be gathered using an array of passive sonar sensors. Each sonar signal may include periodic components resulting from power generation and/or propulsion systems of one or more ocean-going vessels, embedded in strong background noise. When the power spectrum of one such sonar signal is displayed, it will include narrow peaks, some representing narrow frequency-band processes of interest, and some representing noise. If the peaks of interest can be distinguished from the noise, the power spectra of the sonar signals can be studied to classify, and track the position and operational state of each vessel (for example by studying relationships among the center frequencies, bandwidths, and amplitudes, of the peaks of interest over time).

Conventional automated techniques for performing "frequency-tracking" operations have suffered from serious limitations and disadvantages. A principal reason for the shortcomings of the prior art is the difficulty of implementing automated identification of distinct narrow-band features in each signal to be processed, in the general case that the number of features in each signal (and the character of noise in each signal) is unknown and time-varying. As a result, conventional narrow-band feature identification is often performed manually, by operators who manually mark features of interest on a special display.

One conventional approach to automated identification of narrow-band features has been to process the input signals in the time domain, by adaptively updating parameters representing the signals' narrow-band components. However, because this conventional approach assumes that a fixed, known, number of narrow-band components are present in each signal, the approach is unsuitable when the number of such components in each signal is unknown and variable from signal to signal.

Another class of conventional methods for automated identification of narrow-band features has been to process the input signals in the frequency domain. However, these methods either perform poorly (for example, ADEC and related methods such as those described in Mcintyre, et al., "A Comparison of Five Algorithms for Tracking Frequency and Frequency Rate of Change," Proc. ICASSP90, Albuquerque NM, April 1990, which are subject to spurious detections and other artifacts), or computationally very time-consuming and costly (for example, the MAPLE method described in Wolcin, "Estimation of Narrow-band Signal Parameters," J. Acoust. Soc. Am., Vol. 68, No. 1, July 1980).

The conventional ADEC method (to be described with reference to FIG. 1) identifies narrow-band features ("tracks") common to a set of input power spectra ("raw" power spectra) in the following way. Each raw power spectrum is searched over an "association gate" about a predicted track center frequency to select a peak (within the association gate) associated with a previously identified track. The selected peak is then processed to extract narrow-band process parameters therefrom (the "parameter estimation" operation represented in FIG. 1), and smoothing operations are then performed on the extracted process parameters (which can include center frequency, bandwidth, and amplitude) using corresponding parameters previously extracted from previously processed raw power spectra. An updated predicted center frequency, resulting from the smoothing operations, is employed to select subsequent associated peaks.

However, the present inventors have recognized that serious errors result from tight coupling (as in the ADEC method) of the steps of estimating "instantaneous" narrow-band process parameters (of a single raw spectrum) and smoothing the same parameters. For example, relatively large bandwidth processes can support many ADEC tracks, and processes with quickly changing center frequency can be represented by multiple, short-duration ADEC tracks.

SUMMARY OF THE INVENTION

The invention is a method and apparatus for processing a set of signals to identify narrow bandwidth features of the signals, and optionally to process the signals further to extract information about the identified narrow-band features.

The invention processes a set of input signal frames (a multi-dimensional pixel array) to generate a narrow-band feature signal (an indexed list of pixels) from which narrow-band features of the input signal frames can be efficiently, automatically, and unambiguously identified. The set of input signal frames corresponds to an input pixel array which can be displayed as an input image (or sequence of images), and the narrow-band feature signal corresponds to an output pixel array which can be displayed as an output image (or sequence of images).

In a class of preferred embodiments, the input signal frames are the power spectra of a set of sequentially measured signals. Thus, the set of input signal frames corresponds to an array of spectral estimates (a "spectrogram") which can be stored and displayed as rows and columns of pixels (with the row indices representing time, and the column indices representing frequency).

Alternatively, the input signal frames represent a data array of another type, such as a "correlogram" (comprising rows and columns of pixels, with row indices representing time, and column indices representing delay time interval), or a sequence of images (comprising rows and columns of pixels, with row indices representing time, and column indices representing other variables such as spatial position).

In a class of embodiments, the input signal frames are first processed to identify narrow-band pixels (the subset of input signal frame pixels which represent narrow-band energy). A bilevel data array is generated, with the value of each bilevel bit in the array indicating whether or not a corresponding pixel of the narrow-band pixel array represents narrow-band energy. The identified narrow-band pixels (which can be displayed as a narrow-band pixel array) then undergo "feature extraction" processing to generate the output narrow-band feature signal (which can be displayed as the output image).

During the "feature extraction" processing, dilation and erosion operations are performed to bridge gaps between closely spaced contiguous groups of narrow-band pixels, and to delete "stray" groups of narrow-band pixels (each of which stray groups spans a range of time coordinates having duration less than a selected threshold duration). Contiguous sets of narrow-band pixels are grouped into tracks, each representing a single narrow-band process. The narrow-band feature signal is indicative of this collection of extracted narrow-band processes (and indeed, the narrow-band feature signal can be the collection of extracted narrow-band processes).

In preferred embodiments, the inventive method includes the steps of generating input signals at a directional sensor means, in a manner so that each of said input signals is indicative of a different beam of source energy, each said beam corresponding to a different direction, generating a power spectrum for each of said directions, generating an array of input pixels from the power spectra, each of the input pixels having a time coordinate, a frequency coordinate, and a direction coordinate, and processing the input pixels to generate a narrow-band feature signal comprising uniform pixels having substantially uniform value and narrow-band pixels, by replacing the input pixels representing broadband energy with uniform pixels, wherein the narrow-band pixels define a set of narrow-band features. An audio waveform can be generated from at least one of the narrow-band features. Each audio waveform can be displayed (played through speakers, headphones or another audio display device) with apparent directions related to the direction coordinate of each corresponding narrow-band feature.

BRIEF DESCRIPTION OF THE DRAWINGS

FIG. 1 is a diagram representing the steps performed during implementation of a conventional method for characterizing signal narrow-band content.

FIG. 2 is a diagram representing the steps performed during an embodiment of the inventive method.

FIG. 7 is a block diagram of an embodiment of the system of the invention.

FIG. 8 is a block diagram of a second embodiment of the system of the invention.

FIG. 9 is a block diagram of a third embodiment of the system of the invention.

FIG. 10 is a block diagram of a fourth embodiment of the system of the invention.

FIG. 11 is a block diagram of a fifth embodiment of the system of the invention.

DETAILED DESCRIPTION OF THE PREFERRED EMBODIMENT

The architecture of the invention will initially be described with reference to FIG. 2. As shown in FIG. 2, the invention processes a set of input signal frames ("raw spectra") to generate a narrow-band feature signal. Narrow-band features (present but obscured by noise in the raw spectra) can be readily and unambiguously identified from the narrow-band feature signal in automated fashion. Before any smoothing operation is performed on the signals being processed, all three of the following operations are completed: the narrow-band feature signal is generated, narrow-band features are identified, and parameters of the identified narrow-band features are estimated. In contrast, the conventional ADEC method (discussed above with reference to FIG. 1) estimates parameters of narrow-band features of each input spectrum (i.e., parameters of peaks associated with corresponding tracks) only after smoothing corresponding parameters from a previously processed input spectrum. By decoupling the estimation of narrow-band process parameters from their smoothing, the invention avoids introduction of processing artifacts that are commonly introduced by the prior art.

Figure 3:
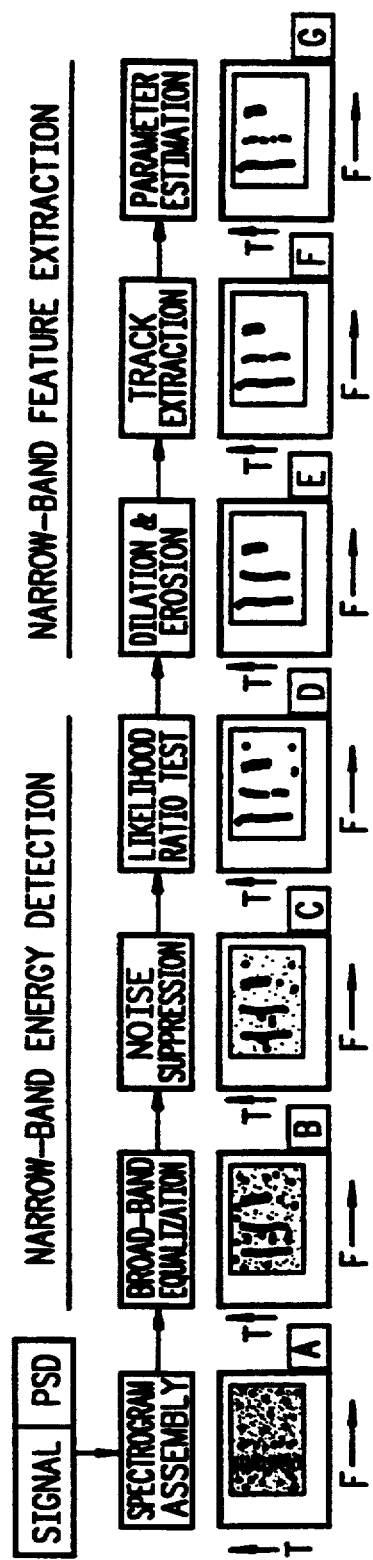
FIG. 3 is a block diagram of the steps performed during a preferred embodiment of the inventive method.

In the preferred embodiment of the invention shown in FIG. 3, the first step ("PSD" or "power spectral density" estimation) is to process a set of input signals (sometimes referred to herein as input signal frames) to generate the power spectrum of each input signal.

Then, during step "A" in FIG. 3, the power spectra are assembled and stored as an array of grey-scale pixels (a "spectrogram" comprised of digital data). The pixels can be displayed as a grey-scale spectrogram image (of the type identified by reference character "A" in FIG. 3), whose row coordinates represent time and whose column coordinates represent frequency. Thus, each row (or "frame") represents a single power spectrum of a signal measured over one time interval.

Any time-frequency analysis method can be employed to generate the spectrogram, including for example, the Short Time Fourier Transform, the Wigner-Ville Transform, and the Wavelet Transform. The subsequent processing steps (described below) will depend to some extent on which time-frequency analysis method is used. Where not otherwise stated below in the specification (not including the claims), we assume that the Short Time Fourier Transform is used. Extensions to other spectrogram representations would be obvious to those of ordinary skill in the art.

Figure 4:
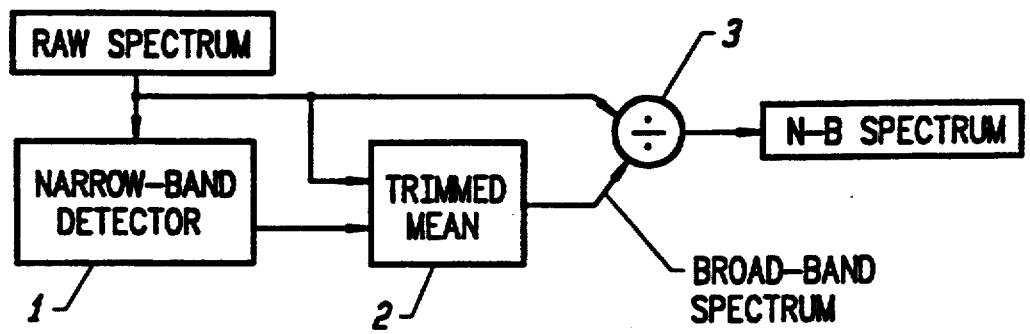
FIG. 4 is a block diagram of a portion of a preferred embodiment of the inventive apparatus (for implementing a portion of the FIG. 3 method).

After step "A," during the narrow-band energy detection phase comprising steps "B," "C," and "D" of FIG. 3, those pixels of the spectrogram which represent narrow-band energy are identified, and components of the spectrogram which represent noise and broad-band energy are suppressed. Step "B" is a broad-band equalization process in which the input spectrogram is converted into a set of "equalized" pixels representing narrow-band energy, by suppressing spectrogram components representing broad-band energy (e.g., dividing or subtracting these components from the spectrogram pixels, depending on whether multiplicative or additive noise, respectively, is assumed) using a broad-band spectral estimate. A preferred embodiment of the broad-band equalization process is indicated schematically in FIG. 4.

Narrow-band energy is detected in narrow-band detector 1 by comparing each pixel value to that of an "average" of its neighbors, and thresholding the result. In this case, by "average" is meant the average or median of a possibly nonlinear function of the pixel values, as dictated by the statistics of the input spectrogram. The output of detector 1 is input along with the raw spectrum to trimmed mean processor 2. For each spectrogram pixel, trimmed mean processor 2 "averages" all pixels in a window about the selected pixel, excluding those pixels determined to contain narrow-band energy according to detector 1. The result is a smoothed version of the input spectrogram without narrow, outlying peaks—i.e., the output is expected to approximate the broad-band part of the raw spectrogram. The broad-band spectrum is removed from the raw spectrum by dividing the raw spectrum by the output of processor 2 in element 3 (or subtracting the output of processor 2 from the raw spectrum in element 3). Element 3 can be a divider or differencer.

Figure 5:
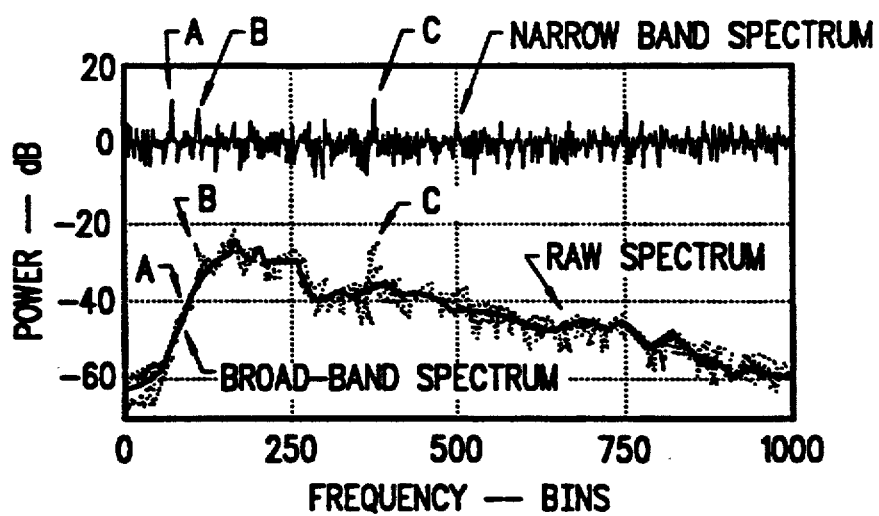
FIG. 5 is a graph representing a raw power spectrum to be processed in accordance with the invention, and a narrow-band spectrum generated therefrom during a "broad-band equalization" step of the inventive method.

FIG. 5 represents a row of equalized pixels, identified as a "narrow-band spectrum," generated during the broad-band equalization process (of step "B" of FIG. 3).

The equalized pixels in this narrow-band spectrum have relatively constant amplitude, save for peaks a, b, and c indicating the presence of narrow-band energy. Note that the pixels in the corresponding input spectrogram row (the pixels identified as the "raw spectrum" in FIG. 5), which represent a combination of narrow-band and broad-band energy, have an amplitude which varies with frequency.

After step "B" of FIG. 3, the equalized pixels undergo noise suppression during step "C." During step "C," the equalized pixels are optionally scaled (by, for example, a piecewise linear or nonlinear function), and one and/or two-dimensional linear and/or nonlinear filters (i.e., averaging and median filters, outrange filters, or the like) are applied to the spectrogram so as to enhance line features and suppress noise.

It turns out that such enhancements may be though of as providing an estimate of signal-to-noise ratio ("SNR"). Assuming the presence of multiplicative noise in the spectrogram, the output of equalization step "B" is indicative of local signal-to-noise ratio or "SNR" (i.e., the ratio of narrow-band to broad-band power). If the SNR is relatively constant over short time periods and over small frequency increments, application of a low-pass or averaging filter (during step "C") to the pixels generated during step "B" will provide an improved estimate of SNR. A filter which averages over a line placed at several orientations, taking the maximum response, will also give a good SNR estimate.

After step "C" (during step "D"), the noise-reduced pixels and equalized pixels are combined and processed to determine which of them represent narrow-band energy and which represent broad-band energy. Processing steps "B," "C," and "D" process the spectrogram in accordance with a likelihood ratio test (or generalized likelihood test). Although such tests are well known in the art, a general description of their theory will be provided next, because it may be helpful to provide an understanding of the invention.

To implement a likelihood ratio test to decide between the hypothesis $H_N$ that a given pixel represents narrow-band energy and the hypothesis $H_B$ that the pixel represents broad-band energy, a likelihood ratio is compared to a threshold value T. The likelihood ratio is the ratio of the probability of observing the pixel given that it represents narrow-band energy to the probability of observing the pixel given that it represents broad-band energy. Assuming that the input signal represents an array of grey-scale pixels whose amplitudes satisfy a Gaussian distribution, that periodogram spectral estimates are used in forming the spectrogram, and that the input signal is approximately stationary over periods of time on the order of the frame length, the likelihood ratio is:

$$SNR_{ij}/[SNR_{ij}+1] \times [X_{ij}/S_{Bij}],$$

where $S_{Bij}$ is the broad-band power spectrum for time frame i at frequency bin j, $SNR_{ij}$ is the corresponding ratio of narrow-band to broad-band power, and $X_{ij}$ is the amplitude of the pixel having time coordinate i in frequency bin j. The factor $X_{ij}/S_{Bij}$ can be interpreted as the measured narrow-band spectrum (the result of processing step "B") , and the factor $SNR_{ij}/[SNR_{ij}+1]$ (an SNR estimate resulting from processing step "C") serves to keep the false identification rate relatively constant across signal-to-noise ratios.

To implement a generalized likelihood ratio test to decide between the hypothesis that a pixel represents narrow-band energy and the hypothesis that the pixel represents broad-band energy, an approximation of the likelihood ratio is compared to the threshold value T. When the likelihood ratio test output is to be edited during further processing to eliminate gaps between detections, the smoothed SNR generated during step "C" is an appropriate approximation to the likelihood ratio. Throughout the specification, including the claims, the phrase "generalized likelihood ratio test" will be employed in a broad sense to denote likelihood ratio tests as well as other generalized likelihood ratio tests, and approximations thereto.

The result of processing noise-reduced pixels during step "D" in accordance with a likelihood ratio (or generalized likelihood ratio) test is to generate one or both of the following data arrays: a narrow-band pixel array; and a classification pixel array. The classification pixel array is a data array whose bits (which are preferably bilevel bits) indicate whether or not each pixel of the narrow-band pixel array represents narrow-band energy. The classification pixel array can be a bit map comprising binary bits having a first value indicating that corresponding pixels of the narrow-band pixel array represent narrow-band energy, and bits having a second value indicating that corresponding pixels of the narrow-band pixel array do not represent narrow-band energy.

The pixels of the narrow-band pixel array are identical to the noise-reduced pixels produced during step "C" (they may also be identical to the equalized pixels of step "B"), except that all noise-reduced pixels determined during step "D" not to represent narrow-band energy are replaced by pixels having a constant amplitude (e.g., zero amplitude). When displayed, the narrow-band pixel array will thus comprise grey-scale pixels (whose arrangement defines narrow-band features) on a contrasting uniform background.

In a variation on method steps "C" and "D" described above, a non-linear scaling operation is initially performed on the pixels generated during step "B," and a low-pass or averaging filter (of the type applied in the above-described embodiments of step "C") is then applied to the scaled pixels. The resulting filtered pixels then undergo a thresholding operation in which they are compared to a threshold value T of the type described above, to generate a bilevel classification pixel array of the type described above. This method is less expensive to implement than the full likelihood ratio test described above.

Next, during steps "E," "F," and "G," the narrow-band pixel array (and the corresponding bilevel data array) undergo feature extraction processing to generate an output narrow-band feature signal. The output narrow-band feature signal can be processed (during final step "G") to characterize parameters (i.e., center frequency, bandwidth, and amplitude) of one or more of its narrow-band features. The output narrow-band feature signal can also be displayed as an output image (of the type shown adjacent to reference character "G" in FIG. 3).

During step "E," dilation and erosion operations are performed to edit the bilevel data array. Gaps are bridged between closely spaced groups of narrow-band pixels (bits representing narrow-band energy). "Stray" narrow-band pixels (or pixel groups) are deleted by changing their binary value (e.g. "one") to the value representing broad-band energy (e.g., "zero"). Narrow-band pixels are considered "stray" if they belong to a group of contiguous narrow-band pixels of duration less than a selected threshold (i.e., a group whose time coordinates span a range smaller than a selected range).

Figure 6:
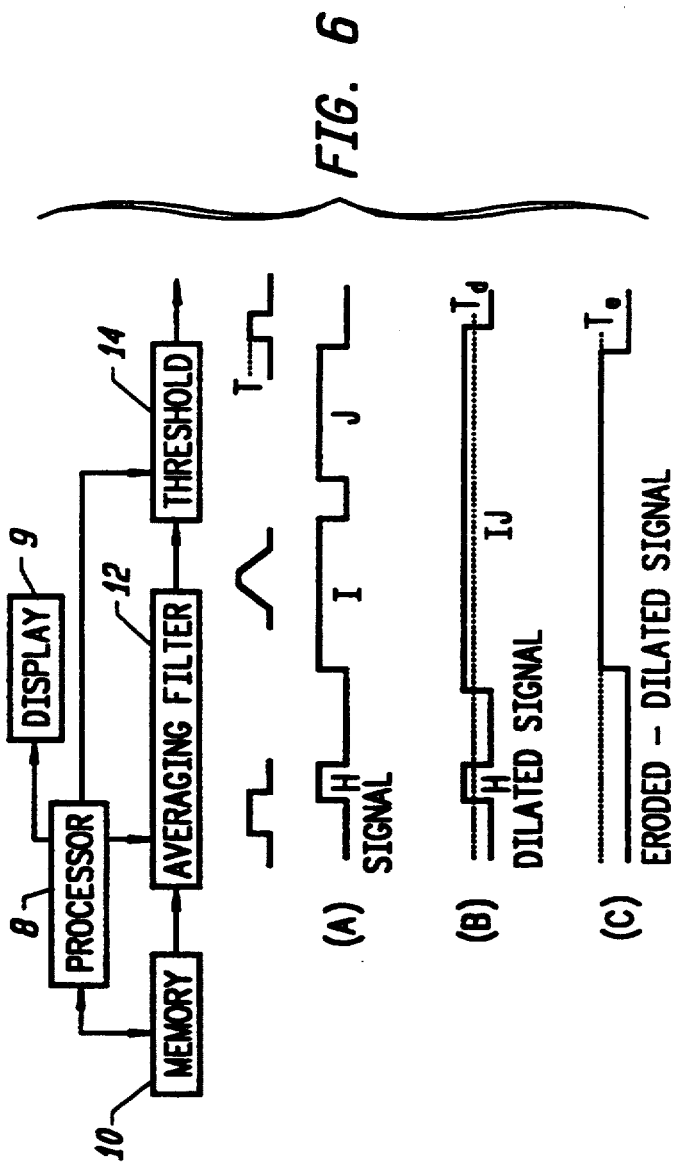
FIG. 6 is a set of graphs representing signals generated during performance of the inventive method.

FIG. 6 shows three signals of the type processed during step "E" of the FIG. 3 method, and a block diagram of an apparatus for performing such processing. Signal "a" in FIG. 6 is generated by reading out columns of the bilevel data array from memory 10 under control of processor 8 (assuming the bilevel data array has been stored in memory 10 during step "D" with each stored row representing data measured at a different time). The pixels comprising signal "a" (and also those comprising signals "b" and "c") can be displayed as a bilevel bit map on display 9 under control of processor 8.

Signal "b" is generated by dilating signal "a" to increase the area covered by each of image regions H, I, and J (to merge adjacent regions I and J). Specifically, the dilation operation is accomplished by processing signal "a" in averaging filter 12 to replace each portion thereof having a selected duration by the average value of the signal over this selected duration. The averaged signal output from filter 12 is then processed in threshold comparator 14 to replace each portion thereof having amplitude less than a selected threshold Td by an amplitude representing a binary "zero" and to replace each portion having amplitude greater than the threshold Td by an amplitude representing a binary "one." Signal "b" can be written into memory 10, or directly asserted to the input of filter 12 for further (erosion) processing.

Signal "c" is generated by eroding signal "b," to decrease the area covered by image regions H and merged region IJ (to delete small region H). Specifically, the erosion is accomplished by processing signal "b" in filter 12 to replace each portion thereof having a selected duration by the average value of the signal over this selected duration. The averaged signal output from filter 12 is then processed in threshold comparator 14 to replace each portion thereof having amplitude less than a selected threshold Te by an amplitude representing a binary "zero" and to replace each portion having amplitude greater than the threshold Te by an amplitude representing a binary "one." If it is desired to bridge g-pixel long (or shorter) gaps while eliminating m-pixel long (or shorter) tracks, an $[m(p=m+g+1)]$-pixel long averaging filter with dilation threshold $T_d=[m+1]/p$, and erosion threshold $T_e=[g+1]/p$ may be used. If $m=g$, a single dilation/erosion step may be used with filter length $2m+1$ and threshold $[m+1]/[2m+1]$. These implementations leave long isolated tracks unchanged.

During step "E" or "F," the updated (dilated and eroded) bit map (which corresponds to signal "c" in the FIG. 6 example) generated during step "E" is employed to generate the output narrow-band feature signal, by updating the narrow-band pixel array stored in step "D" by replacing those of its pixels corresponding to "zero" bits of the updated bit map with pixels having the above-mentioned constant amplitude (e.g., zero amplitude).

With reference again to FIG. 3, during step "F" the updated (dilated and eroded) bit map generated during step "E" is processed to generate a signal identifying each distinct narrow-band feature thereof (i.e., each distinct group of contiguous narrow-band bits thereof).

This can be done by locating each narrow-band bit, and recursively grouping with that bit all adjacent narrow-band bits (in a well-known manner) until an entire contiguous region is included. In general, each extracted region (narrow-band feature) is completely specified by listing, for each frame (time coordinate) in which it exists, the low and high frequency bins (i.e., the low and high column coordinates) encompassed. In the case that two or more separate narrow-band processes cross (or otherwise intersect) in frequency, the extracted region is separated (in a well-known manner) into multiple contiguous regions, each of which having at each time during which it exists a single contiguous span (in frequency) of pixels.

The above-mentioned "output narrow-band feature signal" is processed during final step "G" to characterize parameters (i.e., center frequency, bandwidth, and amplitude) of one or more of its narrow-band features. The parameters can optionally be smoothed, by implementing well-known smoothing operations. The output narrow-band feature signal (or a smoothed version of it) can be displayed as an output image (of the type shown adjacent to reference character "G" in FIG. 3).

Versions of the output narrow-band feature signal (or selected narrow-band features contained therein) can also be displayed (played) as an audio signal through headphones, speakers, or an audio display device. Such audio signal can be synchronized with a scrolling display of the narrow-band feature signal (or spectrogram, or the like) to give the listener a visual indication of the signal content being played. A static display with a time indicator may take the place of such a scrolling display.

On way to construct such an audio signal is to convert each desired narrow-band feature to a waveform, and "mix" or add the resulting set of waveforms. Conversion of a narrow-band feature to a waveform can be accomplished through standard means based on the time history of its extracted parameters, center frequency, bandwidth, amplitude, or the like. Examples of such means include applying a time-varying band-pass filter of appropriate center frequency, bandwidth, and gain to white noise, or computing a sinusoid with the appropriate frequency and amplitude as a function of time. Note that for most applications it is important to properly crossfade between available time samples of narrow-band feature parameters so that no discontinuities appear in the resulting waveform. Note also that the narrow-band feature parameters can be processed or otherwise altered before conversion to audio waveforms (for example, by being stretched in time or shifted in frequency) to enhance certain signal features or achieve some desired effect.

FIG. 7 is a block diagram of an embodiment of the inventive system for processing input signal frames signals measured using hydrophone 22 or accelerometer 24. Hydrophone 22 generates pressure signals which represent pressure waves from source 20. Accelerometer 24 generates acceleration signals representing vibrations of an object under test to which the accelerator is mounted. A sequence of analog signals (each generated at a different measurement time) is asserted at the output of each of hydrophone 22 or accelerometer 24. Analog-to-digital converter 26 is selectively connected to hydrophone 22 or accelerometer 24, to digitize the each analog signal received therefrom (thereby generating a frame of "time series data" as shown in FIG. 7 for each analog signal). Each frame of time series data is processed in power spectrum generation means 28 ("PSD 28") to generate the power spectrum of that frame.

In spectrogram assembly means 30, the power spectra from PSD 28 are assembled and stored as an array of grey-scale pixels (a "spectrogram" comprised of digital data). The pixels can be displayed as a grey-scale spectrogram image (of the type identified as a "spectrogram" in FIG. 7), whose row coordinates represent time and whose column coordinates represent frequency. Each row (or "frame") of the spectrogram represents one of the power spectra asserted at the output of PSD 28.

The pixels comprising the spectrogram are then processed by narrow-band energy detection and feature extraction unit 32, which preferably implements all of steps "B" through "F" described above with reference to FIG. 3.

The narrow-band feature signal asserted at the output of unit 32 is further processed in a conventional manner in either processing means 34 or processing means 35. In the case that the narrow-band feature signal represents energy received at hydrophone 22, it undergoes source classification and localization processing in processing means 34. In the case that the narrow-band feature signal represents energy received at accelerometer 24, it undergoes vibration mode classification and analysis in processing means 35.

It should be appreciated that unit 32 can be implemented as processor 8, display 9, memory 10, filter 12, and comparator 14 shown in FIG. 6. Alternatively, components 28, 30, 32, 34, and 35 of the FIG. 7 system (or components 44 and 46 of the FIG. 9 system discussed below, or components 54, 56, and 58 of the FIG. 10 system discussed below) can all be implemented in software by a computer (i.e., including a processor such as processor 8, memory such as memory 10, and a display such as display 9) appropriately programmed to implement the inventive method.

For musical instrument analysis, music synthesis, and related applications, the invention can be implemented as the system shown in FIG. 9. In this system, microphone 40 receives acoustic energy and generates a sequence of analog output signals. These signals are digitized in A-to-D converter 42, to generate a frame of time series data for each analog signal. The frames of time series data are processed in spectrogram generation means 44, to generate the power spectrum of each time series data frame, and to assemble and store the power spectra as an array of grey-scale pixels (a "spectrogram" comprised of digital data).

The pixels comprising the spectrogram are then processed by narrow-band energy detection and feature extraction unit 46, which preferably implements all of steps "B" through "F" described above with reference to FIG. 3. The narrow-band feature signal asserted at the output of unit 46 (and optionally also the broadband components of the spectrogram) undergoes further processing in a conventional manner. To synthesize musical sounds, stored broad-band and frequency-scaled narrow-band components are played back.

FIG. 10 is an embodiment of the inventive system which is useful for monitoring usage of a non-towered airport. In the FIG. 10 system, microphone 50 (positioned on or near an airport runway) receives acoustic signals and outputs a sequence of analog signals, each representing acoustic vibration of one or more aircraft (and background noise) at a different instant or interval of time. The analog signals are digitized in analog-to digital converter 52 to generate a frame of time series data for each analog signal. The frames of time series data are processed in spectrogram generation means 54, which generates the power spectrum of each time series data frame, and assembles and stores the power spectra as an array of grey-scale pixels (a "spectrogram" comprised of digital data).

The pixels of the spectrogram are then processed by narrow-band energy detection and feature extraction means 56, which preferably implements all of steps "B" through "G" described above with reference to FIG. 3. Parameter signals, characterizing narrow-band features of the narrow-band feature signal generated in unit 56, are asserted at the output of unit 56. The parameter signals undergo further processing in a conventional manner in classification means 58 (which associates parameter signals with aircraft types, such as a propeller or jet airplanes, or aircraft vibration modes). Preferably, classification means 58 is a look-up table which outputs a signal indicative of a particular aircraft type in response to assertion of particular parameter signals at the output of unit 6.

The input signal frames processed by the system of the invention can represent a data array of any of a variety of types. In preferred embodiments of the invention (including those to be described with reference to FIG. 12) the data is processed as an array of rows and columns of pixels, wherein the row index represents time (or another sequencing parameter) and each column index represents a source parameter of interest (the array may have dimensionality greater than two, in which case it will have multiple column indices), and wherein the pixel values are designed to peak near column index sets corresponding to source parameter values. It should be understood that although the row index will be described hereinbelow (including the claims) as representing time, the term "time" will be used in this context in broad sense representing any quantity (e.g., depth in a subterranean formation) which sequences a source parameter of interest.

With reference to FIG. 8, the input signal frames can represent a "correlogram" (consisting of pixels representing values of an auto-correlation or cross-correlation function, with each pixel having a row index representing time and a column index representing a delay time interval). In another example, the input signal frames can represent data gathered from an array of sensors, which has been beamformed, i.e., has been processed so as to emphasize that part of the signal coming from a particular spatial direction or location.

In some embodiments, an entire spectrogram is available at one instant, and processing in accordance with the invention occurs in block fashion (so that data representing several frames is processed simultaneously). Typically, however, the input signal frames are continuously recorded, and all processing steps occur with each new frame (i.e., only one frame is processed at a time).

FIG. 8 is an embodiment of the inventive system which is useful for target tracking. In the FIG. 8 system, hydrophone 60 receives sonar signals (which may have propagated to the hydrophone directly from a source, or may have reflected from one or more reflecting boundaries). Hydrophone 60 outputs a sequence of analog signals, each representing sonar energy (and background noise) received at a different instant or interval of time. The analog signals are digitized in analog-to digital converter 62 to generate a frame of time series data for each analog signal.

The frames of time series data are processed in correlation unit 64. Unit 64 transforms the frames it receives by performing an auto-correlation operation (in the case that only one hydrophone 60 supplies input to unit 64) or a cross-correlation operation (in the case that two or more hydrophones 60 supply input to unit 64) thereon. Each transformed frame asserted at the output of unit 64 consists of grey-scale pixels having amplitude as a function of a delay time interval, and designed to peak at the delay corresponding to that of the source.

The transformed frames are supplied from unit 64 to spectrogram generation means 66, which assembles and stores them as an array of grey-scale pixels (a "correlogram" comprised of digital data) with each pixel having a row index representing time and a column index representing a delay time interval.

The pixels of the correlogram are then processed by narrow-band energy detection and feature extraction means 68 (which preferably implements all of steps "B" through "F" described above with reference to FIG. 3) in the same manner as the spectrogram pixels are processed in the FIG. 7 embodiment. A narrow-band feature signal asserted at the output of unit 68 undergoes further processing in a conventional manner in processor 70, to extract parameters therefrom (for example, parameters representing the range, depth, and velocity of one or more sources of the originally received sonar data).

Figure 12:
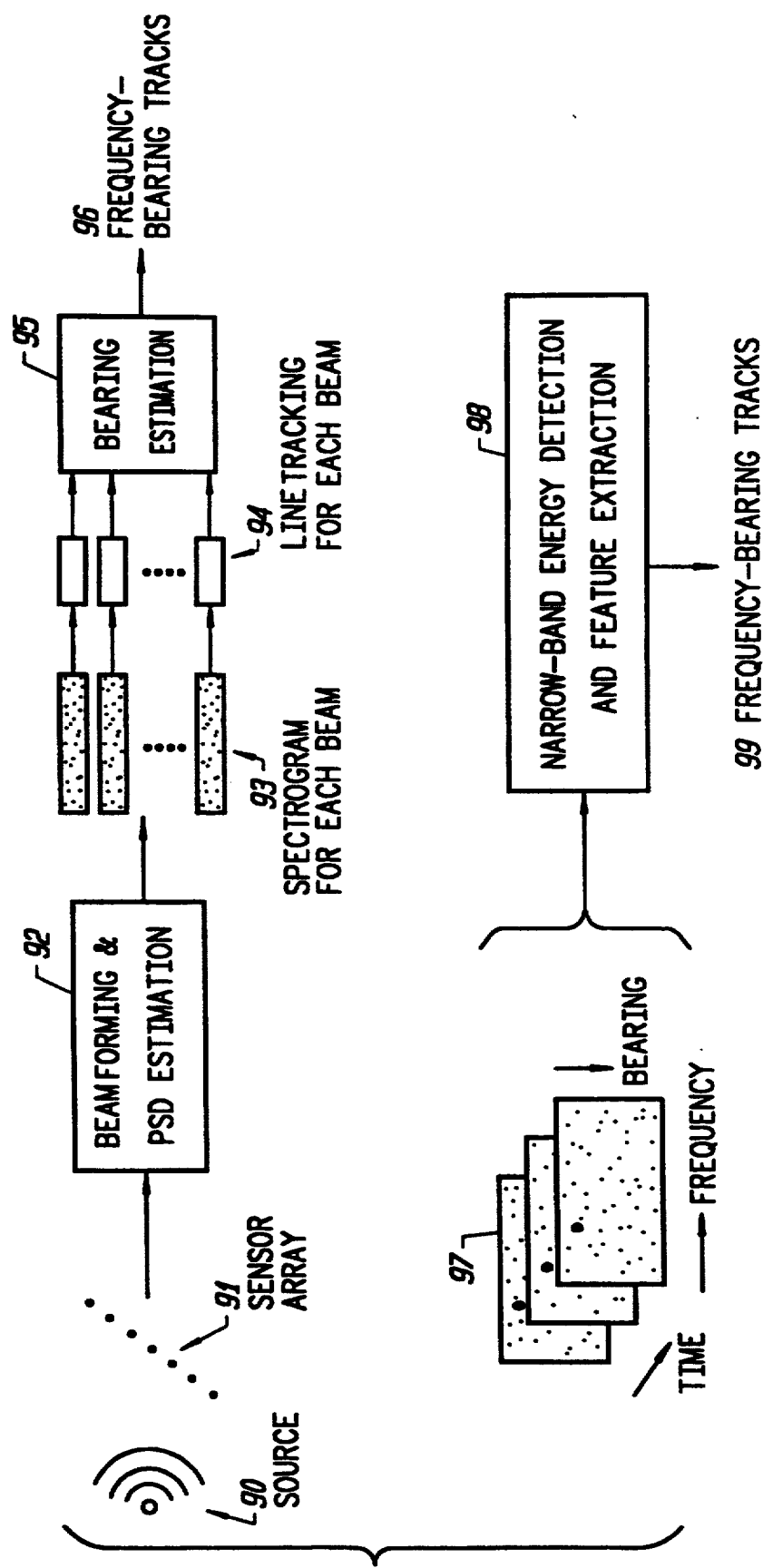
FIG. 12 is a block diagram of another preferred embodiment of the system of the invention.

Embodiments of the invention useful for simultaneously tracking narrow-band features and position will next be described with reference to FIG. 12. Directional sensor means 91 (which can be a sensor array, a rotating directional antenna such as a scanning ESM receiver, or some other directional, positional, or ranging sensor means) receives signals (e.g., acoustic or electromagnetic signals) from radiating or reflecting source 90. Throughout the specification, including in the claims, the expression "directional sensor means" is used in a broad sense to denote any directional, positional, or ranging sensor means. Although the output of such directional sensor means will be described as indicative of a "direction" or "direction coordinate," these latter terms should be understood in a broad sense to denote a direction, position, or range.

In one processing scheme, beamforming and power spectral density estimation means 92 processes the output of directional sensor means 91 to produce a beam spectrogram 93 (an array of grey-scale pixels) for each direction ("beam" or "bearing") or position. Narrow-band energy detection and feature extraction means 94 (sometimes referred to herein as "linetrackers" 94) operates on each beam spectrogram to extract the narrow-band content of the corresponding beam as a function of time. The output of linetrackers 94 is combined in bearing estimator 95 to produce a set of frequency-bearing tracks 96.

An alternative and preferred embodiment simultaneously estimates bearing, center frequency, and other narrow-band process parameters, rather than estimating spectral parameters (center frequencies, etc.) first. This may be accomplished by rearranging the output of beamforming and power spectral density estimation means 92 (sometimes referred to as "beamforming-/time-frequency analyzer" 92) to produce a sequence of frequency-bearing images 97 (one for each time frame) rather than a set of beam spectrograms 93. These images 97 indicate frequency-bearing regions containing energy from source 90 (source energy). The detecting and tracking of these regions over time is accomplished by narrow-band energy detection and feature extraction means 98, wherein the input data array consists of row coordinates representing time, and column coordinates representing frequency and bearing (or position). Means 98 preferably implements all of steps "B" through "F" described elsewhere herein with reference to FIG. 3. Note that because the data received by means 98 is a sequence of images rather than a sequence of one-dimensional functions, multidimensional equivalents of the smoothing, morphological, and other filters described with reference to FIG. 3 should be used where appropriate in implementing means 98.

Any of the frequency-bearing tracks comprising the narrow-band feature signal 99 that is output from means 98 (or any of above-mentioned frequency-bearing tracks 96), can be displayed as a sequence of output images, as a "movie," or may be projected to a plane (e.g., a bearing-time plane or frequency-time plane) and displayed as a single image (optionally using color to indicate the variable which has been projected out). The narrow-band feature signal (or selected narrow-band features thereof) may also be converted to an audio signal and displayed (played) through headphones or some other audio display device. By applying well known techniques, the sound associated with each narrow-band feature may be caused to appear at a location in space related to the feature's bearing and/or range.

The narrow-band feature signal can consist of a classification pixel array of classification pixels corresponding to input pixels 97 (or 93), wherein the classification pixels identify a first subset of the input pixels representing narrow-band energy and a second subset of the input pixels representing broad-band energy. The narrow-band feature signal can be generated so as to comprise uniform pixels having substantially uniform value and narrow-band pixels, wherein each of the input pixels representing broad-band energy corresponds to one of the uniform pixels, and the narrow-band pixels define narrow-band features.

FIG. 11 is another embodiment of the inventive system, which is useful for automated identification and tracking of targets which appear on input images produced by a mosaic sensor. In the FIG. 11 system, a mosaic sensor (not shown) outputs a sequence of images 80, each consisting of a set of pixels having row and column indices representing spatial position. Each image 80 represents pixels registered at a different instant or interval of time. The pixels of images 80 undergo preliminary processing in signal processor 82. For example, processor 82 may generate arrays of difference pixels by subtracting each input pixel from a corresponding pixel of a different input image. Processor 82 then assembles the processed pixels into one or more composite pixel arrays. Each composite pixel array represents a sequence of images, and comprises rows and columns of pixels with row indices representing time and column indices representing spatial position. For example, processor 82 can assemble a composite array comprising subsets of pixels from a sequence of input images 80, so that the row and column indices of the composite array represent, respectively, time and a multi-dimensional position.

The pixels of each composite pixel array asserted at the output of processor 82 are then processed by narrow-band energy detection and feature extraction means 84, which preferably implements all of steps "B" through "F" described above with reference to FIG. 3. A narrow-band feature signal asserted at the output of unit 84 undergoes further processing in a conventional manner in processor 86. For example, processor 86 can extract parameters representing location of one or more targets imaged by input images 80.

Various modifications in the method of the invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. A method for processing a set of input signals, including the steps of:
   generating the input signals at a directional sensor means, in a manner so that each of said input signals is indicative of a different beam of source energy, each said beam corresponding to a different one of a set of directions;
   generating power spectra, consisting of a power spectrum for each of said directions;
   generating an array of input pixels from the power spectra, each of the input pixels having a time coordinate, a frequency coordinate, and a direction coordinate; and
   processing the input pixels to generate a classification pixel array of classification pixels corresponding to the input pixels, wherein the classification pixels identify a first subset of the input pixels representing narrow-band energy and a second subset of the input pixels representing broad-band energy.

2. The method of claim 1, wherein the input signals are generated at the directional sensor means in response to reception of acoustic waves at said directional sensor means.

3. The method of claim 1, wherein the input signals are generated at the directional sensor means in response to reception of electromagnetic waves at said directional sensor means.

4. A method for processing a set of input signals, including the steps of:
   generating the input signals at a directional sensor means, in a manner so that each of said input signals is indicative of a different beam of source energy, each said beam corresponding to a different one of a set of directions;
   generating power spectra, consisting of a power spectrum for each of said directions;
   generating an array of input pixels from the power spectra, each of the input pixels having a time coordinate, a frequency coordinate, and a direction coordinate; and
   processing the input pixels to generate a narrow-band feature signal comprising uniform pixels having substantially uniform value and narrow-band pixels, by replacing the input pixels representing broad-band energy with said uniform pixels, and wherein the narrow-band pixels define a set of narrow-band features.

5. The method of claim 4, also including the step of:
   generating an audio waveform from at least one of the narrow-band features.

6. The method of claim 5, also including the step of displaying the audio waveform with apparent directions related to the direction coordinate of each of said at least one of the narrow-band features.

* * * * *